(12) United States Patent
Park et al.

(10) Patent No.: US 9,691,601 B2
(45) Date of Patent: Jun. 27, 2017

(54) SUPPORTING UNIT AND SUBSTRATE-TREATING APPARATUS INCLUDING THE SAME

(71) Applicants: SAMSUNG ELECTRONICS CO., LTD., Suwon-si (KR); KNU-INDUSTRY COOPERATION FOUNDATION, Chuncheon-si (KR)

(72) Inventors: Sang-Hyun Park, Yongin-si (KR); Sangdon Jang, Suwon-si (KR); In Bae Chang, Chuncheon-si (KR)

(73) Assignees: SAMSUNG ELECTRONICS CO., LTD., Suwon-si (KR); KNU-INDUSTRY COOPERATION FOUNDATION, Chuncheon-si (KR)

( * ) Notice: Subject to any disclaimer, the term of this patent is extended or adjusted under 35 U.S.C. 154(b) by 0 days.

(21) Appl. No.: 15/168,995

(22) Filed: May 31, 2016

(65) Prior Publication Data

US 2016/0375534 A1  Dec. 29, 2016

(30) Foreign Application Priority Data

Jun. 23, 2015  (KR) .......................... 10-2015-0089254

(51) Int. Cl.
*H01F 1/00* (2006.01)
*H01L 21/00* (2006.01)

(52) U.S. Cl.
CPC .................................. *H01L 21/00* (2013.01)

(58) Field of Classification Search
CPC ................. B23Q 3/1543; B23Q 3/1546; H02K 2201/18; H02K 41/031; H01L 21/00
See application file for complete search history.

(56) References Cited

U.S. PATENT DOCUMENTS

| | | | |
|---|---|---|---|
| 5,886,432 A | 3/1999 | Markle | |
| 6,054,784 A * | 4/2000 | Sperling | ............. G03F 7/70716 108/20 |
| 6,111,332 A | 8/2000 | Post | |
| 6,441,514 B1 | 8/2002 | Markle | |
| 6,445,093 B1 * | 9/2002 | Binnard | ............. G03F 7/70716 250/491.1 |
| 6,657,344 B2 | 12/2003 | Post | |
| 6,661,127 B2 | 12/2003 | Frissen et al. | |
| 6,847,134 B2 | 1/2005 | Frissen et al. | |
| 7,161,657 B2 | 1/2007 | De Weerdt | |
| 7,245,047 B2 | 7/2007 | Vreugdewater et al. | |
| 8,212,435 B2 | 7/2012 | Binnard et al. | |
| 8,247,943 B2 | 8/2012 | Prucher | |

(Continued)

FOREIGN PATENT DOCUMENTS

KR  101174092 B1  8/2012

*Primary Examiner* — Bernard Rojas
(74) *Attorney, Agent, or Firm* — Sughrue Mion, PLLC

(57) ABSTRACT

A supporting unit is provided. The supporting unit includes a body, an alignment member, at least one sensor, and a controller. The body has a top surface supporting a target object. The alignment member is disposed in the body and adjusts a position of the target object. The sensor senses the position of the target object. The controller controls the alignment member and the sensor member. The alignment member includes a magnet that adjusts the position of the target object according to an electromagnetic force; and a coil that applies the electromagnetic force to the magnet.

20 Claims, 18 Drawing Sheets

(56) References Cited

U.S. PATENT DOCUMENTS

| | | |
|---|---|---|
| 8,294,316 B2 | 10/2012 | Blackwelder et al. |
| 8,581,463 B2 | 11/2013 | Post |
| 8,994,239 B2 | 3/2015 | Peng et al. |
| 2002/0079888 A1 | 6/2002 | Frissen et al. |
| 2003/0042812 A1 | 3/2003 | Post |
| 2004/0017116 A1 | 1/2004 | Frissen et al. |
| 2004/0263000 A1 | 12/2004 | Vreugdewater et al. |
| 2005/0030503 A1 | 2/2005 | De Weerdt |
| 2008/0165450 A1 | 7/2008 | Binnard et al. |
| 2009/0086177 A1* | 4/2009 | Vosters ............... G03F 7/70716 355/53 |
| 2009/0289512 A1 | 11/2009 | Prucher |
| 2011/0024567 A1 | 2/2011 | Blackwelder et al. |
| 2011/0291507 A1 | 12/2011 | Post |
| 2012/0007704 A1 | 1/2012 | Nerl |
| 2013/0009735 A1 | 1/2013 | Nath et al. |
| 2013/0229078 A1 | 9/2013 | Garber |
| 2014/0077627 A1 | 3/2014 | Schaffel et al. |
| 2014/0084731 A1 | 3/2014 | Iwami et al. |
| 2014/0132102 A1 | 5/2014 | Peng et al. |
| 2014/0354243 A1 | 12/2014 | Oelofse |
| 2015/0061440 A1 | 3/2015 | Catalan |

* cited by examiner

SUPPORTING UNIT AND SUBSTRATE-TREATING APPARATUS INCLUDING THE SAME

CROSS-REFERENCE TO RELATED APPLICATION

This application claims priority from Korean Patent Application No. 10-2015-0089254, filed on Jun. 23, 2015 in the Korean Intellectual Property Office, the disclosure of which is hereby incorporated by reference in its entirety.

BACKGROUND

The present disclosure relates to a supporting unit and a substrate-treating apparatus including the same and, more particularly, to a substrate support capable of aligning a target object (i.e., an object to be treated) in a non-contact manner by an electromagnetic force, and a substrate-treating apparatus including the same.

To perform a process on a substrate, the substrate should be located at a regular position on a supporting plate in a substrate-treating apparatus. Typically, an alignment mechanism is provided to position the substrate. However, there are disadvantages in that, as the number of degrees of freedom of movement of the substrate increases, the complexity of an alignment mechanism increases, and the movable range of the substrate may be limited. Thus, accuracy of a determined position of the substrate and rotation of the substrate may be limited.

SUMMARY

One or more exemplary embodiments provide a supporting unit capable of smoothly moving in 6 degrees of freedom and a substrate-treating apparatus including the same.

One or more exemplary embodiments also provide a supporting unit capable of performing accurate position alignment and of rotating at high speed and a substrate-treating apparatus including the same.

According to an aspect of an exemplary embodiment, there is provided a substrate-treating apparatus including a supporting unit on which a substrate is loaded, the supporting unit including a body having a top surface on which the substrate is loaded; an alignment member disposed in the body to adjust a position of the substrate; at least one sensor configured to sense the position of the substrate; and a controller configured to control the alignment member and the sensor, wherein the alignment member includes a magnet that adjusts the position of the substrate according to an electromagnetic force; and a coil that applies the electromagnetic force to the magnet.

The magnet may be a Halbach array.

The magnet may have a ring shape.

The coil may overlap with the magnet.

The coil may include a plurality of coils, and the plurality of coils may be arranged along a circumference direction of the magnet.

The plurality of coils may include eight coils.

The controller may be configured to supply a current to at least two coils of the plurality of coils to generate the electromagnetic force such that the substrate has 6 degrees of freedom so as to be aligned.

The body may include an upper body and a lower body, the upper body having the top surface on which the substrate is loaded, and the supporting unit may further include an elevating member that is positioned in a hollow region at a center of the magnet in the body, the elevating member configured to elevate the upper body with respect to the lower body.

The magnet may include a plurality of permanent magnets having 6 sets of the Halbach array.

According to an aspect of another exemplary embodiment, there is provided a supporting unit including a body having a top surface supporting a target object; an alignment member disposed in the body and configured to adjust a position of the target object; at least one sensor configured to sense the position of the target object; and a controller configured to control the alignment member and the sensor, wherein the alignment member includes a magnet that adjusts the position of the target object according to an electromagnetic force; and a coil that applies the electromagnetic force to the magnet.

The magnet may be a Halbach array.

The magnet may be a ring shape.

The coil may include a plurality of coils, and the plurality of coils may be arranged along a circumference direction of the magnet.

The plurality of coils may include eight coils.

The controller may be configured to supply a current to at least two coils of the plurality of coils to generate the electromagnetic force such that the target object has 6 degrees of freedom so as to be aligned.

According to an aspect of another exemplary embodiment, there is provided a supporting unit including a moveable upper body; a stationary lower body; an alignment member disposed between the moveable upper body and the stationary lower body and configured to move the moveable upper body by an electromagnetic force such that the moveable upper body moves with six degrees of freedom with respect to the stationary lower body; and a controller configured to control the alignment member to move the moveable upper body.

The alignment member may include a magnet and a coil, one of which is attached to the moveable upper body and the other of which is attached to the stationary lower body, wherein the controller is configured to supply a current to the coil in order to generate the electromagnetic force between the magnet and the coil to move the moveable upper body.

The magnet may include a plurality of permanent magnet fragments arranged in a ring, the coil may include a plurality of coils arranged along the ring, and the controller may supply a current to at least two of the plurality of coils.

The permanent magnetic fragments may be arranged in at least one Halbach array.

The supporting unit may further include an elevating member that is positioned at a center of the ring and configured to elevate the moveable upper body with respect to the stationary lower body in order to load or unload a substrate on the moveable upper body.

BRIEF DESCRIPTION OF THE DRAWINGS

The above and other aspects will become more apparent in view of the attached drawings and accompanying detailed description, in which.

DETAILED DESCRIPTION

Figure 1:
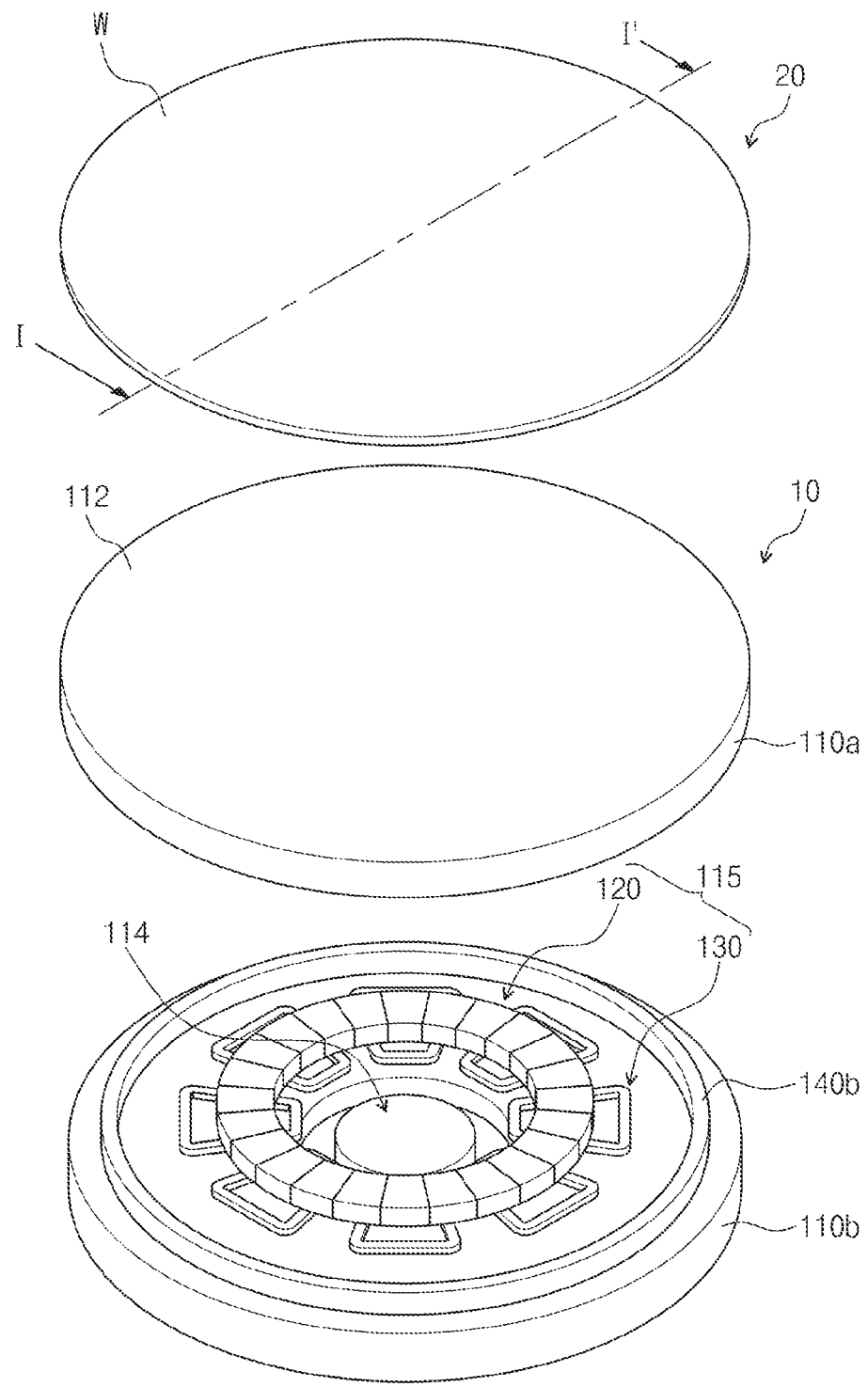
FIG. 1 is an exploded perspective view illustrating a substrate support according to an exemplary embodiment.

Exemplary embodiments will now be described more fully hereinafter with reference to the accompanying drawings, in which various exemplary embodiments are shown. The advantages and features and methods of achieving the advantages and features will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, various exemplary embodiments are not limited to the specific examples provided herein and are exaggerated for clarity. The same reference numerals or the same reference designators denote the same elements throughout the specification.

The terminology used herein is for the purpose of describing particular exemplary embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, exemplary embodiments are described herein with reference to cross-sectional views and/or plan views that are idealized exemplary illustrations. Accordingly, variations from the shapes of the illustrations as a result, for example, of manufacturing techniques and/or tolerances, are to be expected. Thus, various exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
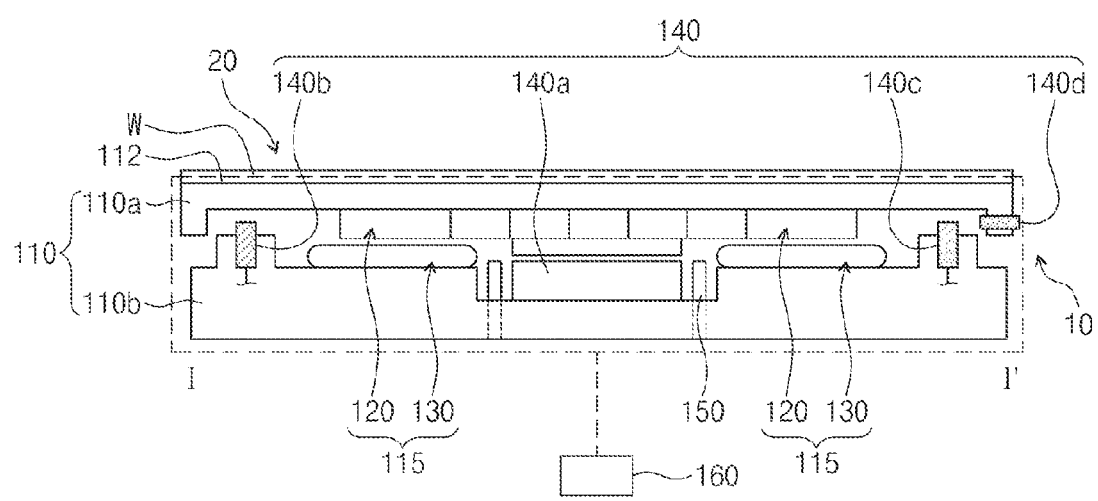
FIG. 2 is a cross-sectional view taken along a line I-I' of FIG. 1.

FIG. 1 is an exploded perspective view illustrating a substrate support according to an exemplary embodiment. FIG. 2 is a cross-sectional view taken along a line I-I' of FIG. 1. Referring to FIGS. 1 and 2, a supporting unit 10 may include a body 110, an alignment member 115, a sensor member 140, an elevating member 150, and a controller 160.

A target object 20 (i.e., an object to be treated) may be supported on a top surface 112 of the body 110. For example, the target object 20 may be a substrate W. Even though the substrate W is shown as separated from the body 110 in the drawings, the target object 20 may be absorbed on the body 110 by vacuum pressure provided through a vacuum line disposed in the body 110. The body 110 may have a circular plate shape. However, the shape of the body 110 is not limited to the circular plate shape and different geometries are also usable. The body 110 may include a first body 110a and a second body 110b which are coupled to each other. In some exemplary embodiments, the first body 110a may correspond to an upper body 110a, and the second body 110b may correspond to a lower body 110b. As illustrated in FIG. 2, the upper body 110a may rise from the lower body 110b. The target object 20 and a magnet part 120 may be coupled to the upper body 110a, so the target object 20 may be moved by movement of the magnet part 120.

Figure 3A:
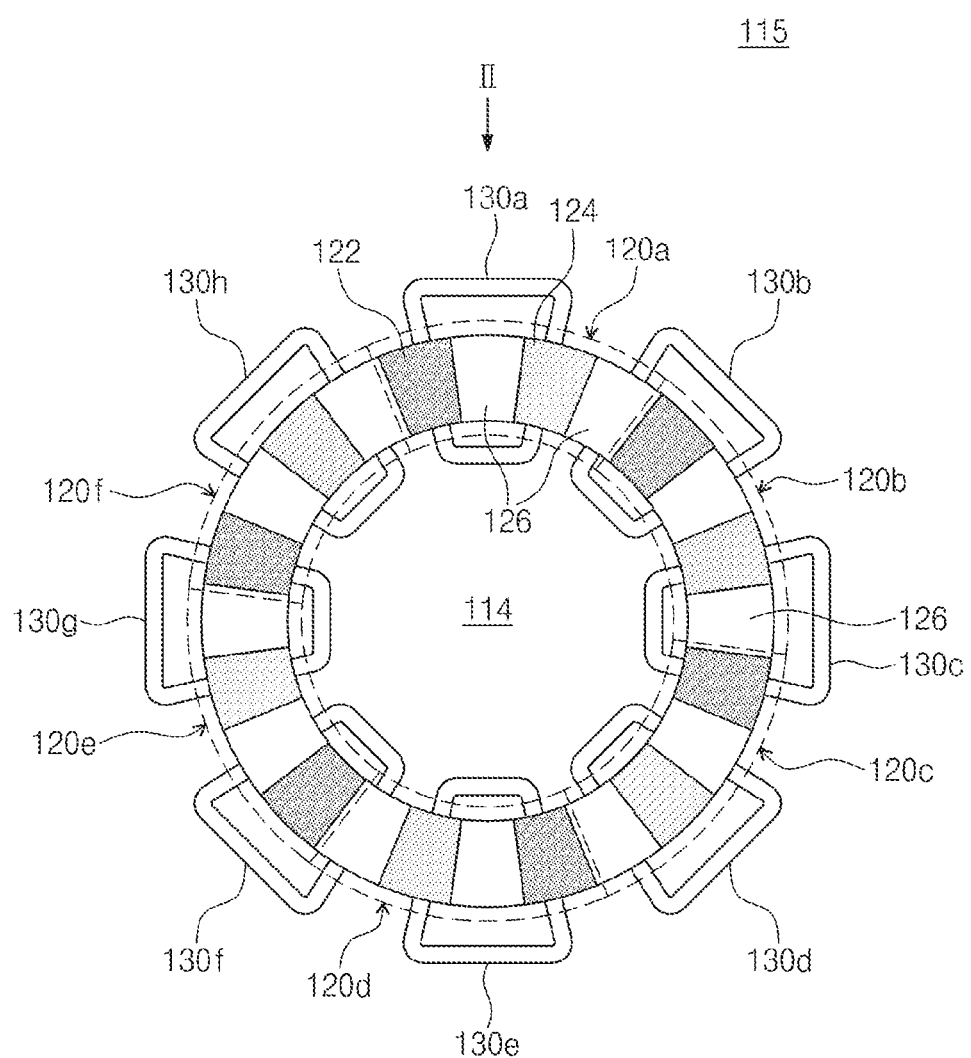
FIG. 3A is a top view of an alignment member of the supporting unit of FIG. 1.
Figure 3B:
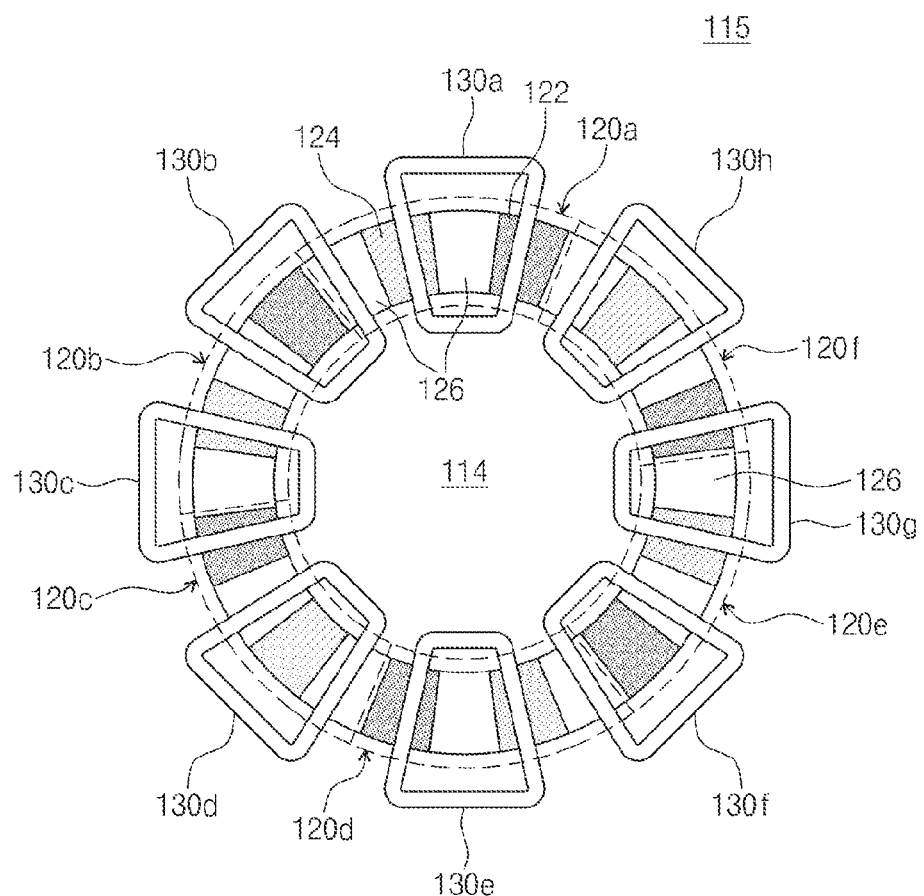
FIG. 3B is a bottom view of the alignment member of FIG. 3A.
Figure 3C:
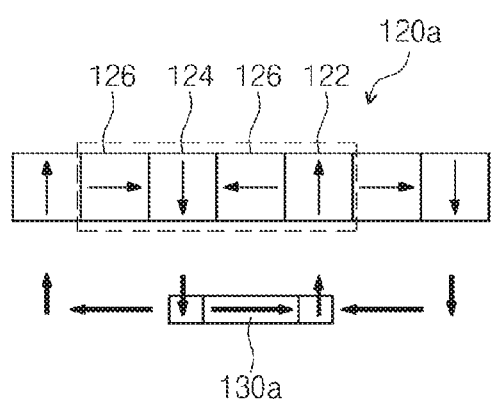
FIG. 3C is a side view of the alignment member of FIG. 3A when viewed in a direction II.

FIG. 3A is a top view of the alignment member 115 of the supporting unit 10 of FIG. 1. FIG. 3B is a bottom view of the alignment member 115 of FIG. 3A. FIG. 3C is a side view of the alignment member of FIG. 3A when viewed from a direction II in FIG. 3A. Hereinafter, the alignment member 115 will be described with reference to FIGS. 1, 2, 3A, 3B, and 3C. The alignment member 115 may align a position of the target object 20. In some exemplary embodiments, the alignment member 115 may align the position of the target object 20 in a non-contact manner by using an electromagnetic force. The target object 20 may include a magnetic material so as to be aligned by the electromagnetic force. The alignment member 115 may include the magnet part 120 and a coil part 130. The magnet part 120 may align the target object 20 using the electromagnetic force. The magnet part 120 may include a permanent magnet. Referring to FIGS. 3A to 3C, the magnet part 120 may have a ring shape having a hollow region 114. The magnet part 120 may have a Halbach array. The magnet part 120 may align the target object 20 by the electromagnetic force such that the target object 20 has 6 degrees of freedom (6 DOF).

The Halbach array was proposed by Klaus Halbach in 1979. The Halbach array may include a plurality of arranged permanent magnet fragments to generate a magnetic field distribution used in a motor system. In the Halbach array, one magnetic pole may be divided into a plurality of magnetic pole fragments, and an anisotropic direction (i.e., a direction of an easy axis) of each of the magnetic pole fragments may be adjusted stepwise. A magnetic field in a specific direction may be augmented by the Halbach array. The augmented magnetic field may increase the Lorentz force to effectively control disturbance.

The magnet part 120 may include a plurality of permanent magnets. In some exemplary embodiments, as illustrated in FIGS. 3A to 3C, the magnet part 120 may include permanent magnet part 120a,120b,120c,120d,120e, and 120f having 6 sets of the Halbach arrays. In some exemplary embodiments, one permanent magnet part may have one set of the Halbach array. In some exemplary embodiments, the permanent magnet part 120a,120b,120c,120d,120e, and 120f may include a first permanent magnet part 120a, a second permanent magnet part 120b, a third permanent magnet part 120c, a fourth permanent magnet part 120d, a fifth permanent magnet part 120e, and a sixth permanent magnet part 120f which are sequentially arranged clockwise from a reference designator II of FIG. 3A. The first permanent magnet part 120a may include two magnetic pole magnet fragments 122 and 124 and two guide magnet fragments 126. The guide magnet fragment 126 may be disposed between the magnetic pole magnet fragments 122 and 124. In some exemplary embodiments, the magnetic pole magnet fragments 122 and 124 and the guide magnet fragments 126 may be alternately arranged in a clockwise direction. A first magnetic pole magnet fragment 122 may have magnetic force lines facing downward, and a second magnetic pole magnet fragment 124 may have magnetic force lines facing upward. (See, e.g., FIG. 3C). The guide magnet fragments 126 may guide the magnetic force lines, and a magnetization direction of the guide magnet fragment 126 may be a direction from the first magnetic pole magnet fragment 122 toward the second magnetic pole magnet fragment 124. Thus, the guide magnet fragments 126 may face the magnetic force lines outputted from the first magnetic pole magnet fragment 122 toward the second magnetic pole magnet fragment 124. The magnetic force lines outputted upward from the magnet part 120 may not be condensed but may spread. However, the magnetic force lines outputted downward from the magnet part 120 may be condensed. Thus, the magnet part 120 may minimize an intensity of the magnetic field generated over the magnet part 120 and may condense the magnetic field generated under the magnet part 120. Structures and arrangements of the second, third, fourth, fifth, and sixth permanent magnet part 120b, 120c, 120d, 120e, and 120f may be the same or similar as those of the first permanent magnet part 120a, so repeated descriptions thereof are omitted.

An electromagnetic force may be applied to the coil part 130 in various directions, depending on a direction of a current flowing through the coil part 130. A force affecting the magnet part 120 may be generated from the coil part 130 by the electromagnetic force induced from the coil part 130. Thus, the force affecting the coil part 130 may also be generated from the magnet part 120 by the principle of action and reaction. In addition, a repulsive force with respect to the force induced from the coil part 130 may be generated from the magnet part 120. The coil part 130 may be fixed on the lower body 110b. Thus, the coil part 130 may remain stationary even though the electromagnetic force is generated from the coil part 130. As a result, the magnet part 120 may be moved to rise from the coil part 130. Accordingly, the target object 20 may also be moved along with the magnet part 120.

The coil part 130 may overlap with the magnet part 120 when viewed from a plan view. The coil part 130 may be disposed under the magnet part 120. (See, e.g., FIG. 3A). The coil part 130 may include a plurality of coils 130a, 130b, 130c, 130d, 130e, 130f, 130g, and 130h. For example, the coil 130 may include eight coils 130a, 130b, 130c, 130d, 130e, 130f, 130g, and 130h. The eight coils 130a, 130b, 130c, 130d, 130e, 130f, 130g, and 130h may be arranged along a circumference direction of the magnet part 120. As illustrated in FIGS. 3A to 3C, the eight coils 130a, 130b, 130c, 130d, 130e, 130f, 130g, and 130h may include a first coil 130a, a second coil 130b, a third coil 130c, a fourth coil 130d, a fifth coil 130e, a sixth coil 130f, a seventh coil 130g, and an eighth coil 130h which are arranged clockwise from the reference designator II of FIG. 3A. The first coil 130a may have a loop shape. The first coil 130a may have a wedge shape so as to be parallel to magnet polarizations of the magnet part 120. In other words, the first coil 130a may have an inner portion disposed inside the magnet part 120 that has the ring shape and an outer portion disposed outside of the magnet part 120 when viewed from a plan view. Accordingly, the inner portion of the first coil 130a may have a short length, and the outer portion of the first coil 130a may have a long length. Shapes and structures of the second, third, fourth, fifth, sixth, seventh, and eighth coils 130b, 130c, 130d, 130e, 130f, 130g, and 130h may be the same or similar as those of the first coil 130a, so repeated descriptions thereof will be omitted.

Referring again to FIG. 2, the sensor member 140 may be provided in the body 110. The sensor member 140 may include a plurality of sensors. In this case, the plurality of sensors may be provided at a plurality of positions of the first body 110a and/or the second body 110b. The sensor member 140 may include a first sensor 140a, a second sensor 140b, a third sensor 140c, and a fourth sensor 140d. The first sensor 140a may overlap with the hollow region 114 of the magnet part 120. The first sensor 140a may be an encoder. The sensor member 140 may check whether the target object 20 is aligned or not. The sensor member 140 may check whether the target object 20 is aligned in 6 degrees of freedom (directions of movement) or not.

Referring again to FIG. 2, the elevating member 150 may be provided in the body 110. The elevating member 150 may elevate or lower the target object 20 for loading or unloading of the target object 20. The elevating member 150 may overlap with the hollow region 114 of the magnet part 120. Since the magnet part 120 has the ring shape, it is possible to secure a space through which the elevating member 150 is vertically moved. As a result, a size of the supporting unit 10 may be reduced. Selectively, a cooling line or a vacuum line may be additionally provided in the hollow region 114. It will be understood that other geometries may also provide the space through which the elevating member 150 is vertically moved and/or a region through which a cooling line or a vacuum line may be provided.

The controller 160 may control the alignment member 115 and the sensor member 140. The controller 160 may control a current flow of the coil part 130 such that the target object 20 may be moved to have the 6 degrees of freedom. In some exemplary embodiments, the controller 160 may select one of the eight coils 130a, 130b, 130c, 130d, 130e, 130f, 130g, and 130h and may control a direction of the current flowing through the selected coil to move and align the target object 20.

Figure 4A:
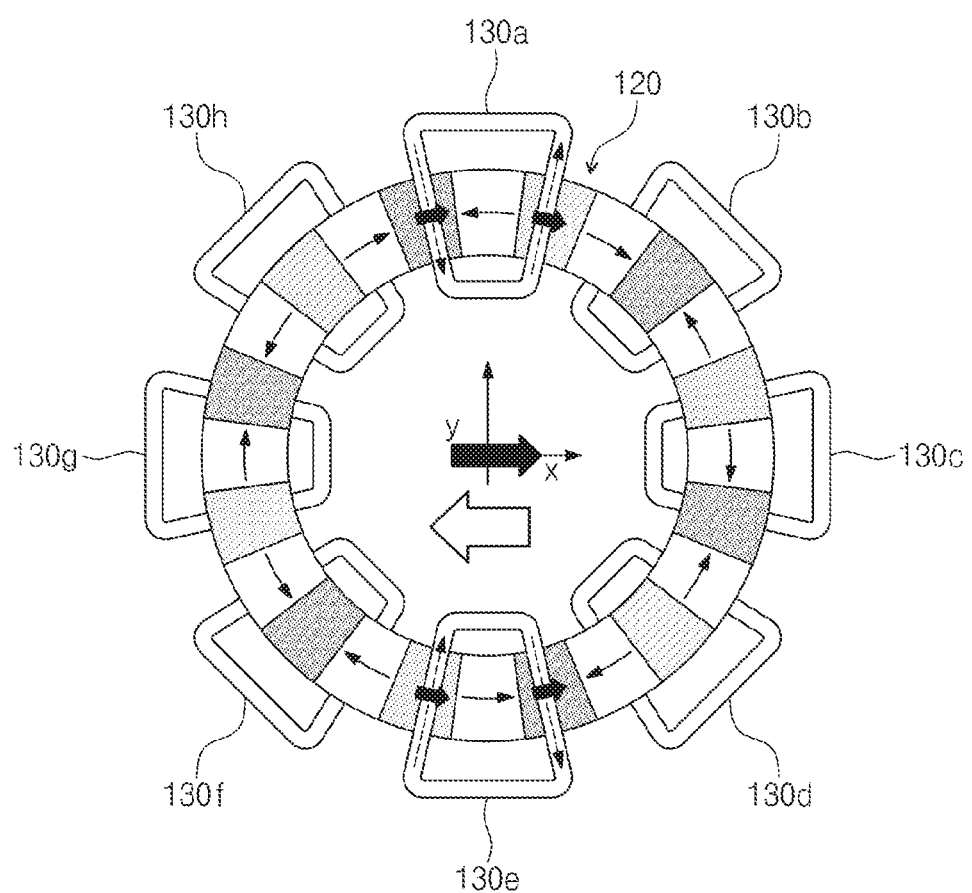
FIGS. 4A to 4F are views illustrating states where a controller controls a coil of the alignment member of FIG. 3A to control moving directions of a target object.
Figure 4B:
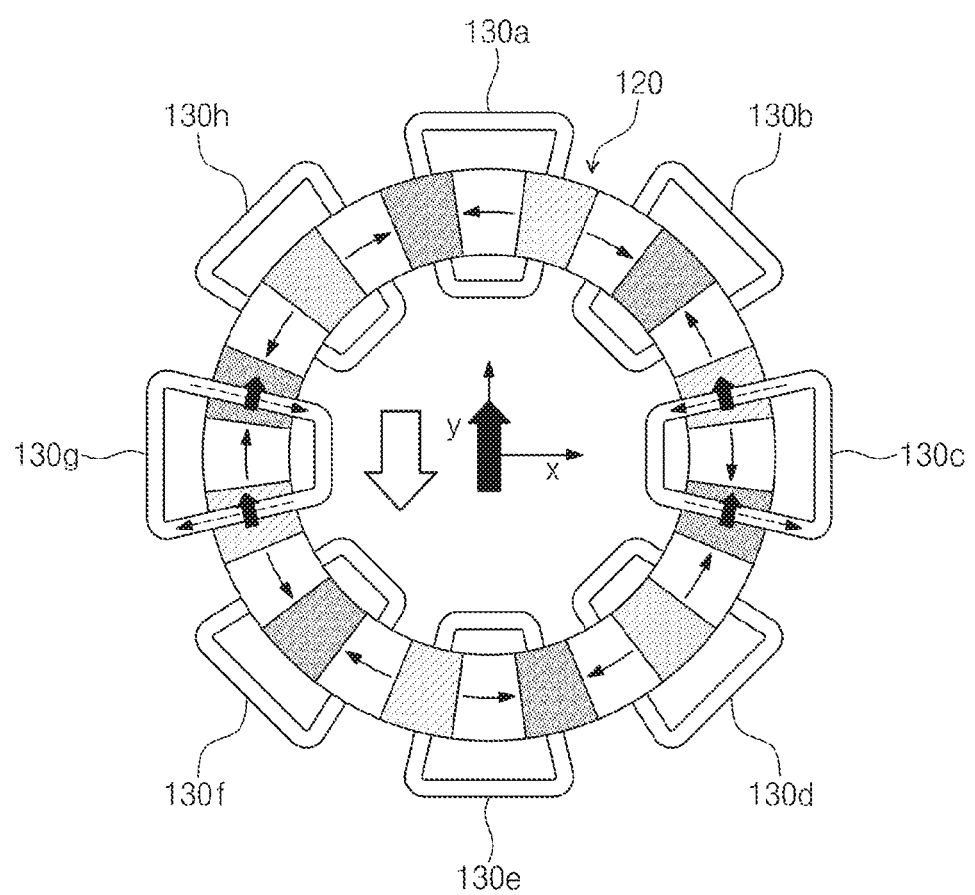
Figure 4C:
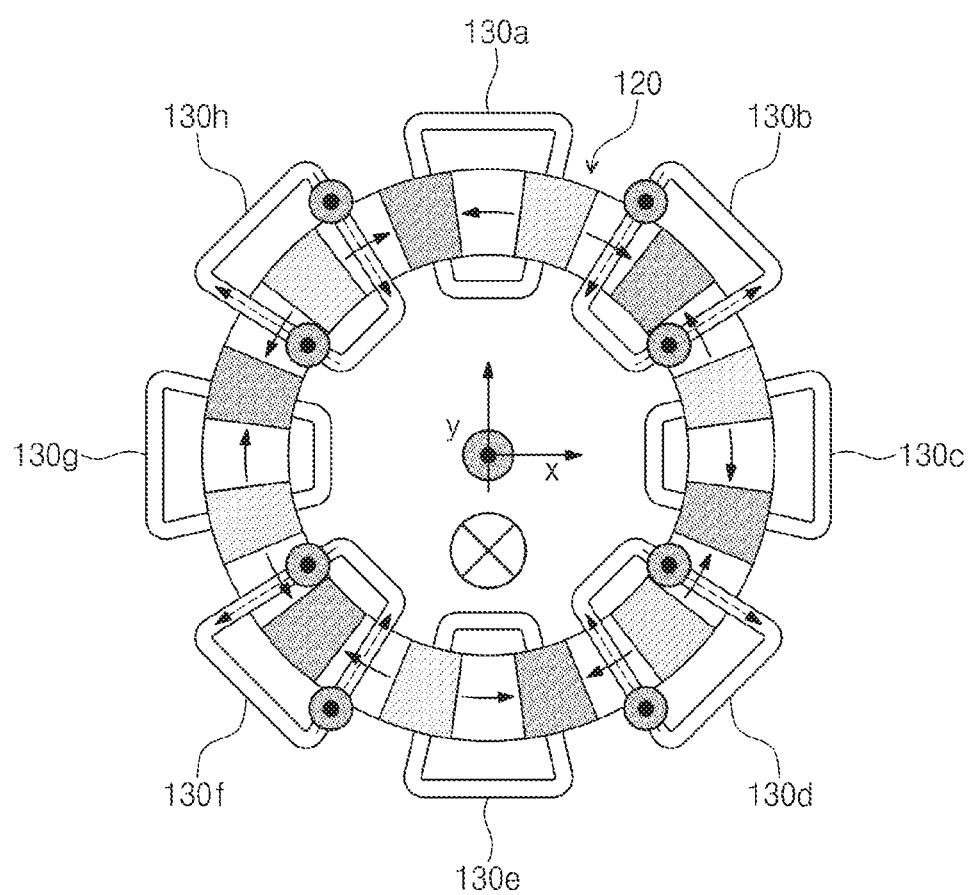
Figure 4D:
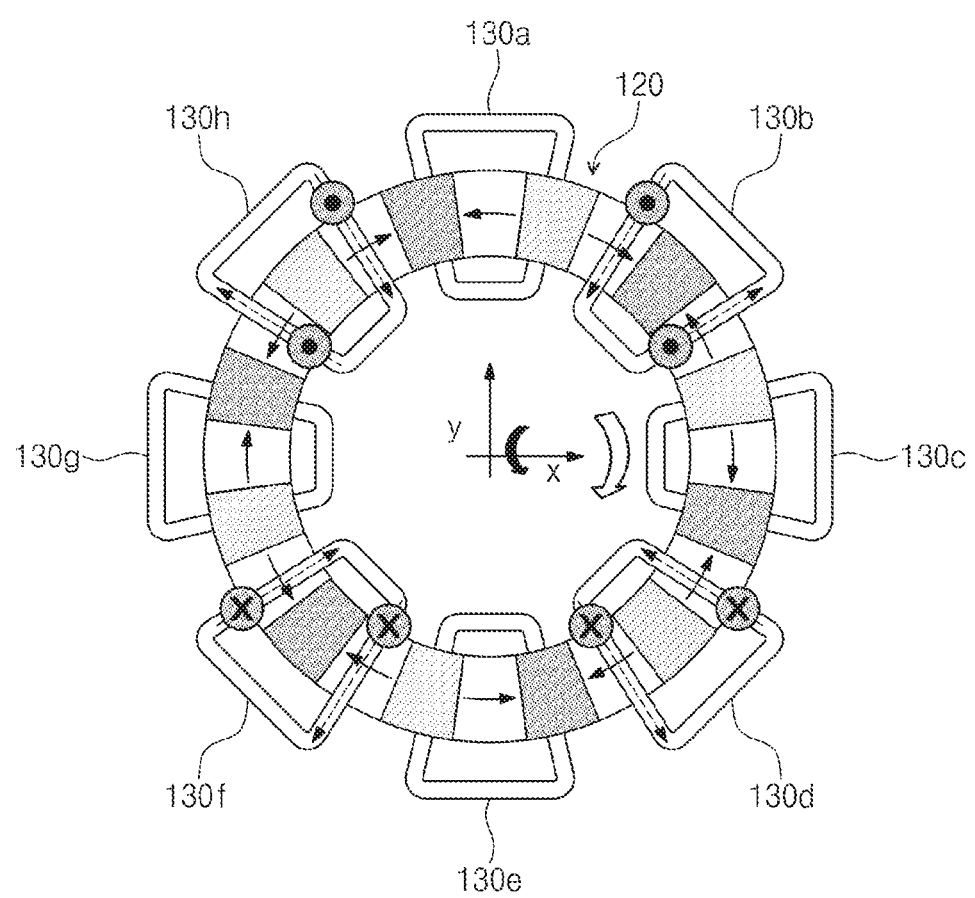
Figure 4E:
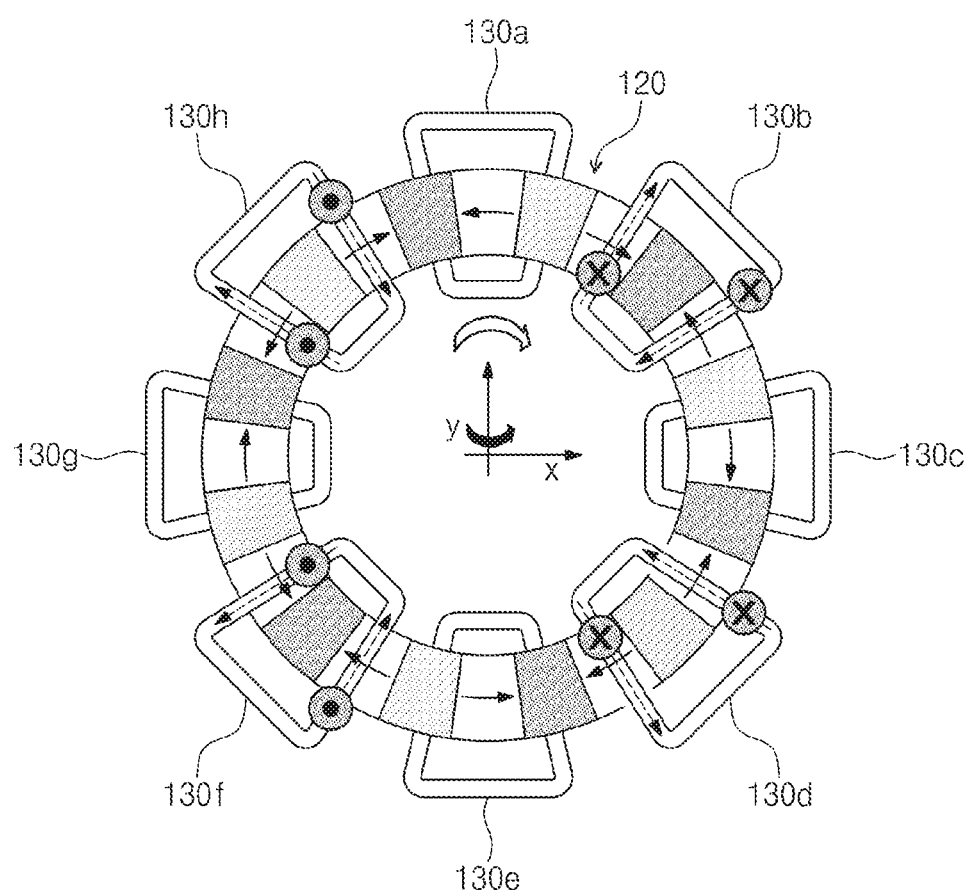
Figure 4F:
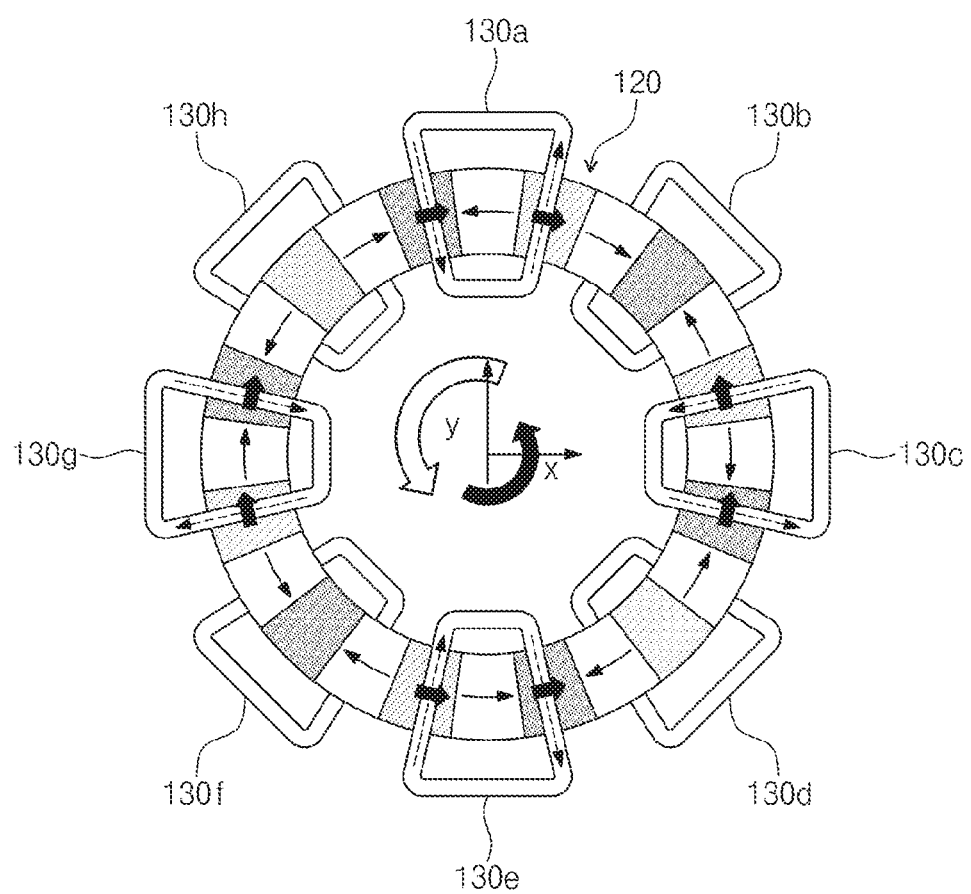

FIGS. 4A to 4F are views illustrating states where a controller controls a coil part of FIG. 3A to control moving directions of a target object. In more detail, FIG. 4A illustrates a state where the controller 160 controls the coil part 130 to move the target object 20 along an x-axis. FIG. 4B illustrates a state where the controller 160 controls the coil part 130 to move the target object 20 along a y-axis. FIG. 4C illustrates a state where the controller 160 controls the coil part 130 to move the target object 20 along a z-axis. FIG. 4D illustrates a state where the controller 160 controls the coil part 130 to rotate the target object 20 on the x-axis. FIG. 4E illustrates a state where the controller 160 controls the coil part 130 to rotate the target object 20 on the y-axis. FIG. 4F illustrates a state where the controller 160 controls the coil part 130 to rotate the target object 20 on the z-axis. FIGS. 4A to 4F illustrate the alignment member 115 when viewed from a plan view. However, in FIGS. 4A to 4F, the coils through which currents flow are illustrated on the magnet part 120 for the purpose of ease and convention in explanation. However, the coil 130 may be substantially disposed under the magnet part 120. In addition, in FIGS. 4A to 4F, a dotted line arrow denotes a direction in which the current is applied, a solid line arrow denotes a direction of the magnetic field, a thick black arrow denotes a direction of a resultant force of forces applied to the coil 130 by the Lorentz force, and a thicker white arrow denotes a moving direction of the target object 20.

Referring to FIG. 4A, the controller 160 may supply currents to the first coil 130a and the fifth coil 130e. Since the currents are supplied to the first and fifth coils 130a and 130e, the electromagnetic forces may be induced to the coil part 130 by the Lorentz force. As illustrated in FIG. 4A, the resultant force in an x-axis direction may be applied to the first and fifth coils 130a and 130e, but the coil part 130 is fixed and is not moved. Thus, the magnet part 120 may be moved in a direction opposite to the x-axis direction (i.e., in a −x-axis direction shown by the thick white arrow in the center of the figure).

Referring to FIG. 4B, the controller 160 may supply currents to the third coil 130c and the seventh coil 130g. Since the currents are supplied to the third and seventh coils 130c and 130g, the electromagnetic forces may be induced to the coil part 130 by the Lorentz force. As illustrated in FIG. 4B, the resultant force in a y-axis direction may be applied to the third and seventh coils 130c and 130g, but the coil part 130 is fixed and is not moved. Thus, the magnet part 120 may be moved in a direction opposite to the y-axis direction (i.e., in a −y-axis direction shown by the thick white arrow in the center of the figure).

Referring to FIG. 4C, the controller 160 may supply currents to the second coil 130b, the fourth coil 130d, the sixth coil 130f, and the eighth coil 130h. Since the currents are supplied to the second, fourth, sixth and eighth coils 130b, 130d, 130f and 130h, the electromagnetic forces may be induced to the coil part 130 by the Lorentz force. As illustrated in FIG. 4C, the resultant force in a z-axis direction may be applied to the second, fourth, sixth and eighth coils 130b, 130d, 130f and 130h, but the coil part 130 is fixed and is not moved. Thus, the magnet part 120 may be moved in a direction opposite to the z-axis direction (i.e., in a −z-axis direction shown by the thick white arrow in the center of the figure).

Referring to FIG. 4D, the controller 160 may supply currents to the second coil 130b, the fourth coil 130d, the sixth coil 130f, and the eighth coil 130h. Since the currents are supplied to the second, fourth, sixth and eighth coils 130b, 130d, 130f and 130h, the electromagnetic forces may be induced to the coil part 130 by the Lorentz force. In this case, as illustrated in FIG. 4D, the electromagnetic force in the z-axis direction may be applied to the second coil 130b and the eighth coil 130h disposed at a front side of the x-axis passing through a central point of the magnet part 120 in a plan view, but the electromagnetic force in the −z-axis direction may be applied to the fourth coil 130d and the sixth coil 130f disposed at a rear side of the x-axis in a plan view. However, since the coil part 130 is fixed and is not moved, a portion of the magnet part 120 disposed at the front side of the x-axis in a plan view may receive the force in the −z-axis direction, and another portion of the magnet part 120 disposed at the rear side of the x-axis in a plan view may receive the force in the z-axis direction. Thus, the magnet part 120 may be rotated on the x-axis.

Referring to FIG. 4E, the controller 160 may supply currents to the second coil 130b, the fourth coil 130d, the sixth coil 130f, and the eighth coil 130h. Since the currents are supplied to the second, fourth, sixth and eighth coils 130b, 130d, 130f and 130h, the electromagnetic forces may be induced to the coil 130 by the Lorentz force. In this case, as illustrated in FIG. 4E, the electromagnetic force in the z-axis direction may be applied to the sixth coil 130f and the eighth coil 130h disposed at a left side of the y-axis passing through the central point of the magnet part 120 in a plan view, but the electromagnetic force in the −z-axis direction may be applied to the second coil 130b and the fourth coil 130d disposed at a right side of the y-axis in a plan view. However, since the coil part 130 is fixed and is not moved, a portion of the magnet part 120 disposed at the left side of the y-axis in a plan view may receive the force in the −z-axis direction, and another portion of the magnet part 120 disposed at the right side of the y-axis in a plan view may receive the force in the z-axis direction. Thus, the magnet part 120 may be rotated on the y-axis.

Referring to FIG. 4F, the controller 160 may supply currents to the first coil 130a, the third coil 130c, the fifth coil 130e, and the seventh coil 130g. Since the currents are supplied to the first, third, fifth and seventh coils 130a, 130c, 130e and 130g, the electromagnetic forces may be induced to the coil part 130 by the Lorentz force. A direction of a resultant force of the electromagnetic forces induced by the first, third, fifth and seventh coils 130a, 130c, 130e and 130g may be in a clockwise direction around the z-axis. However, the coil part 130 is fixed and is not moved. Thus, the magnet part 120 may be rotated in a counterclockwise direction around the z-axis.

As described above, the supporting unit 10 including the alignment member 115 may freely move the target object 20 in the 6 degrees of freedom. Thus, it is possible to super-accurately align the position of the target object 20. In addition, since the coils supplied with the currents and supplying directions of the currents are controlled, the supporting unit 10 may easily align the target object 20. In particular, the target object 20 may be freely moved along the x-axis, the y-axis and z-axis and may also be freely rotated on each of the axes. Thus, the controller 160 may sense position data of the target object 20 using the sensor member 140, thereby aligning the target object 20 at a regular position. In addition, the target object 20 may be aligned using the alignment member 115 included in the supporting unit 10, so the supporting unit 10 may omit an additional driving member or motor. As a result, a size and a layout of an apparatus including the supporting unit 10 may be reduced. Furthermore, the supporting unit 10 may rotate the target object 20 at high speed. Thus, the supporting unit 10 may also be applied to a centrifugal machine.

Figure 5A:
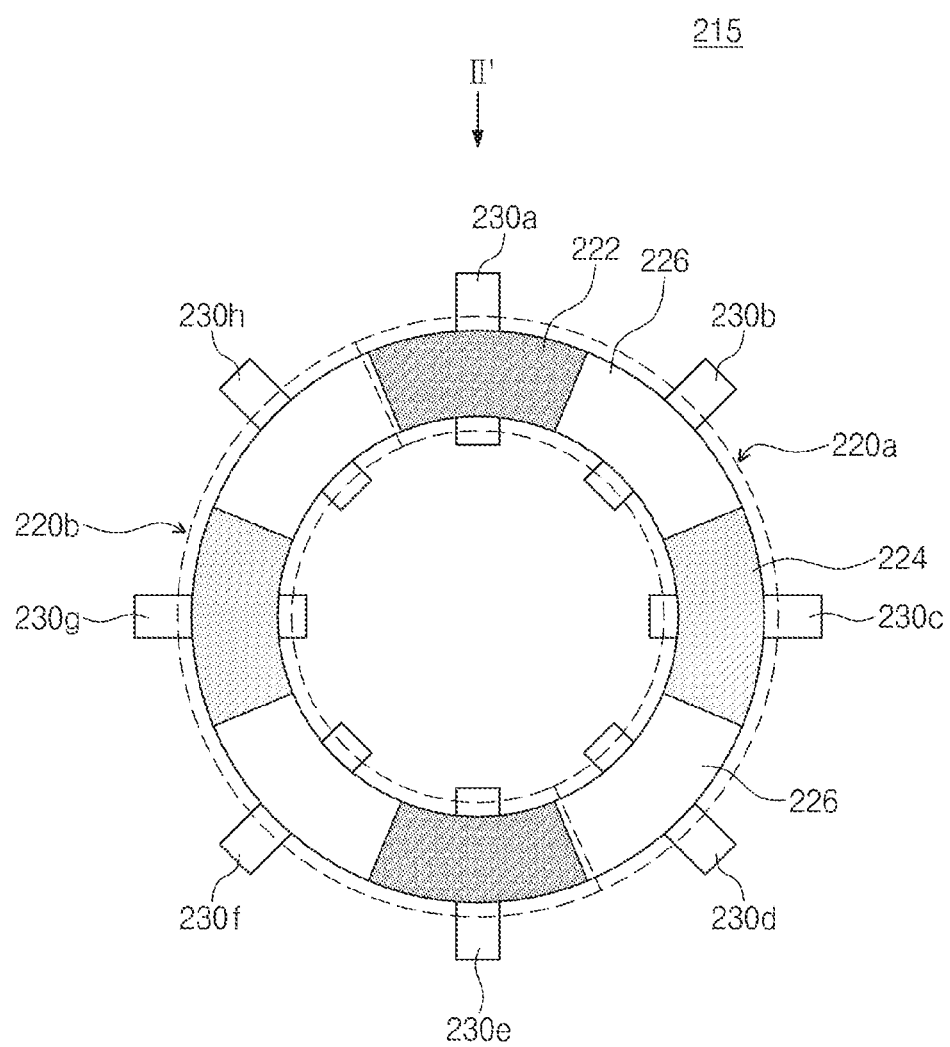
FIG. 5A is a top view of an alignment member according to another exemplary embodiment.
Figure 5B:
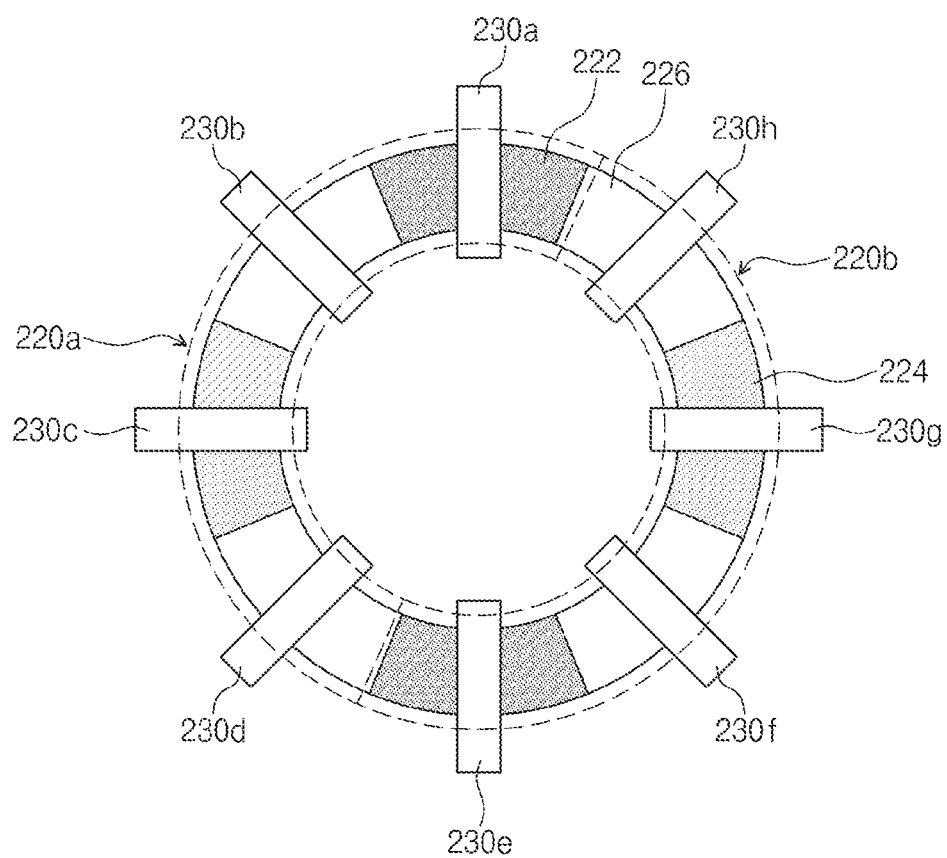
FIG. 5B is a bottom view of the alignment member of FIG. 5A.

FIG. 5A is a top view of an alignment member according to another exemplary embodiment. FIG. 5B is a bottom view of the alignment member of FIG. 5A. An alignment member 215 of FIGS. 5A and 5B may include a magnet part 220 and a coil part 230. The alignment member 215 of the exemplary embodiment shown in FIGS. 5A and 5B may be used in place of the alignment member 115 of the supporting unit 10 of FIGS. 1 and 2. The magnet part 220 may align a target object 20 using electromagnetic force. The magnet part 220 may include a permanent magnet. The magnet part 220 may have a ring shape. The magnet part 220 may include the Halbach array. The magnet part 220 may move the target object 20 by the electromagnetic force such that the target object 20 may have 6 degrees of freedom. Referring to FIGS. 5A and 5B, the magnet part 220 may include a first permanent magnet 220a and a second permanent magnet 220b having two sets of the Halbach arrays. In some exemplary embodiments, one permanent magnet may have one set of the Halbach array. For example, the first permanent magnet 120a may include two magnetic pole magnet fragments 222 and 224 and two guide magnet fragments 226. The guide magnet fragment 226 may be disposed between the magnetic pole magnet fragments 222 and 224. In some exemplary embodiments, the magnetic pole magnet fragments 222 and 224 and the guide magnet fragments 226 may be alternately arranged in a clockwise direction. Each of the permanent magnets 220a and 220b may have the same or similar shape and structure as the permanent magnet described with reference to FIGS. 3A to 3C. Hereinafter, the same descriptions as in the above exemplary embodiments will be omitted or mentioned briefly for conciseness.

An electromagnetic force may be applied to the coil part 230 in various directions, depending on a direction of a current flowing through the coil part 230. A force affecting the magnet part 220 may be generated from the coil part 230 by the electromagnetic force induced from the coil part 230. Thus, a force affecting the coil part 230 may also be generated from the magnet part 220 by the principle of action and reaction. In addition, a repulsive force with respect to the force induced from the coil part 230 may be generated from the magnet part 220. The coil part 230 may be fixed on the lower body 110b (See, e.g., FIG. 2). Thus, the coil part 230 may not be moved even though the electromagnetic force is generated from the coil part 230. As a result, the magnet part 220 may be moved with respect to the coil part 230 so as to rise form the coil part 230. Accordingly, the target object 20 may also be moved along with the magnet part 220.

The coil part 230 may overlap with the magnet part 220 when viewed from a plan view. The coil part 230 may be disposed under the magnet part 220. The coil part 230 may include a plurality of coils 230a, 230b, 230c, 230d, 230e, 230f, 230g, and 230h. For example, the coil part 230 may include eight coils 230a, 230b, 230c, 230d, 230e, 230f, 230g, and 230h. The coils 230a, 230b, 230c, 230d, 230e, 230f, 230g, and 230h may be arranged along a circumference direction of the magnet part 220. The eight coils 230a, 230b, 230c, 230d, 230e, 230f, 230g, and 230h may include a first coil 230a, a second coil 230b, a third coil 230c, a fourth coil 230d, a fifth coil 230e, a sixth coil 230f, a seventh coil 230g, and an eighth coil 230h which are arranged clockwise from a reference designator II' of FIG. 5A. The first coil 230a may have a linear shape. Both ends of the first coil 230a having the linear shape may be connected to the inside of the body 110. Shapes and structures of the second, third, fourth, fifth, sixth, seventh, and eighth coils 230b, 230c, 230d, 230e, 230f, 230g, and 230h may be the same or similar as those of the first coil 230a, so repeated descriptions thereof will be omitted.

Figure 6A:
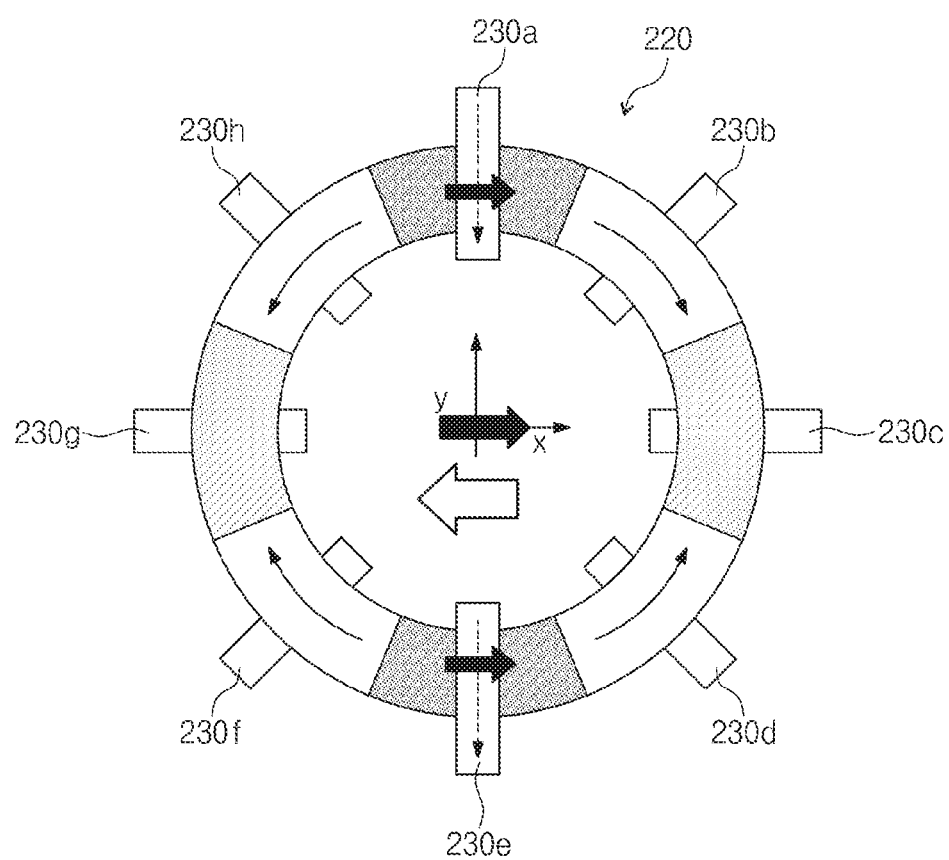
FIGS. 6A to 6F are views illustrating states where a controller controls a coil of the alignment member of FIG. 5A to control moving directions of a target object.
Figure 6B:
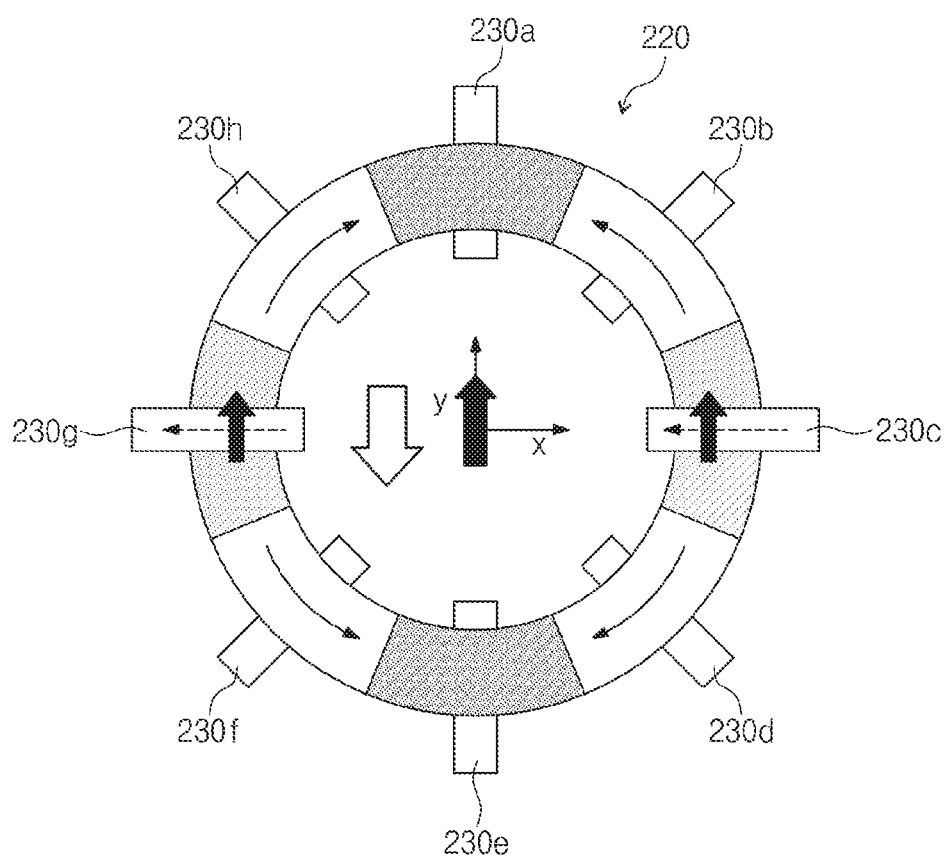
Figure 6C:
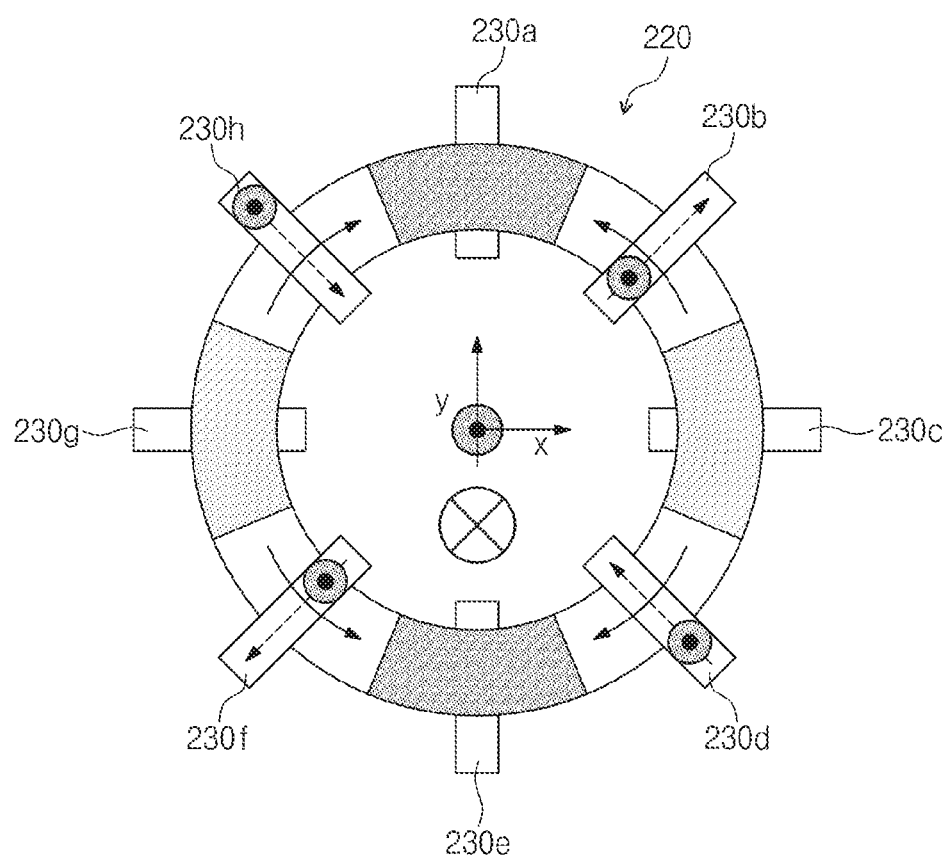
Figure 6D:
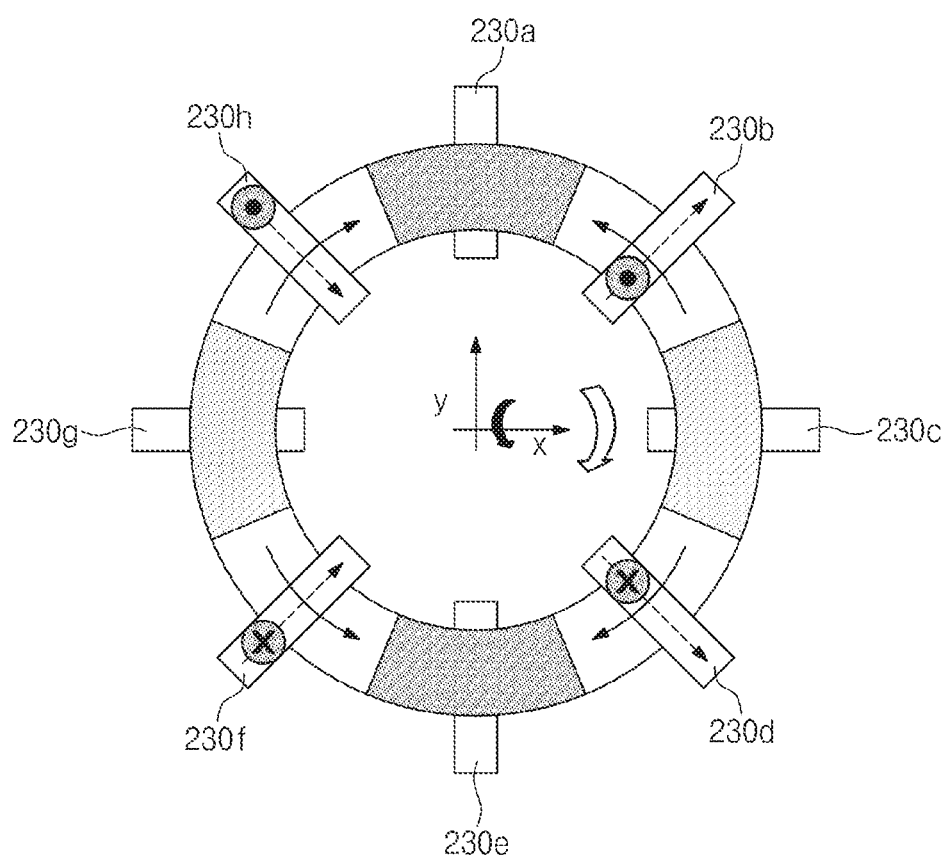
Figure 6E:
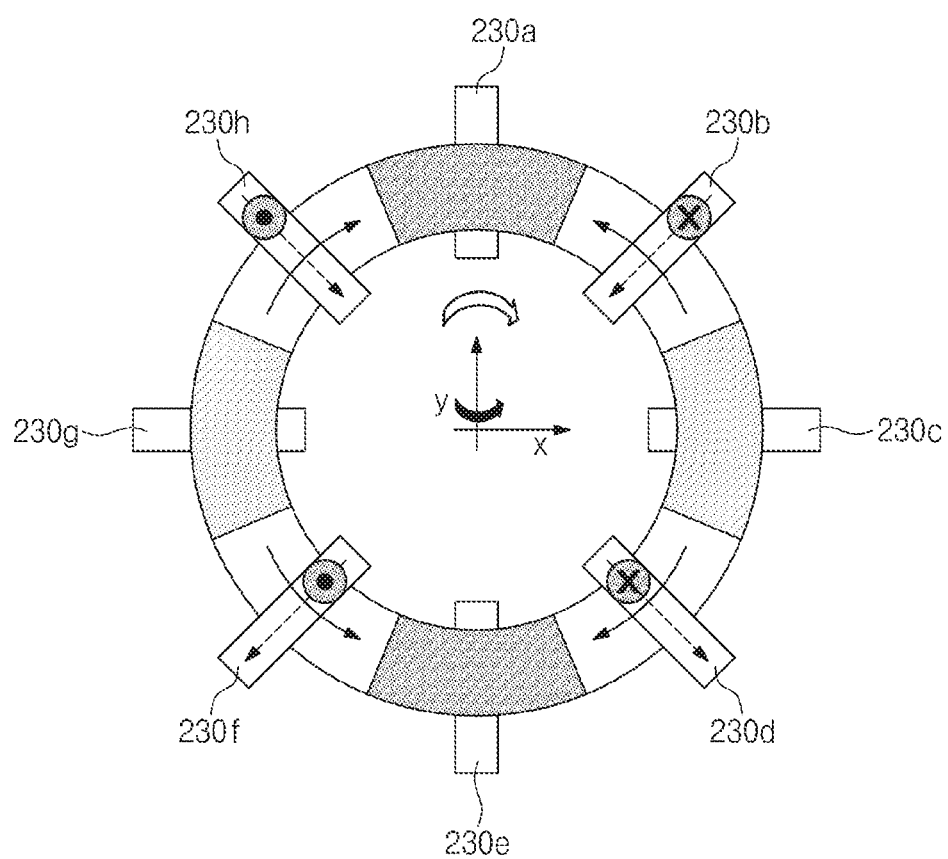
Figure 6F:
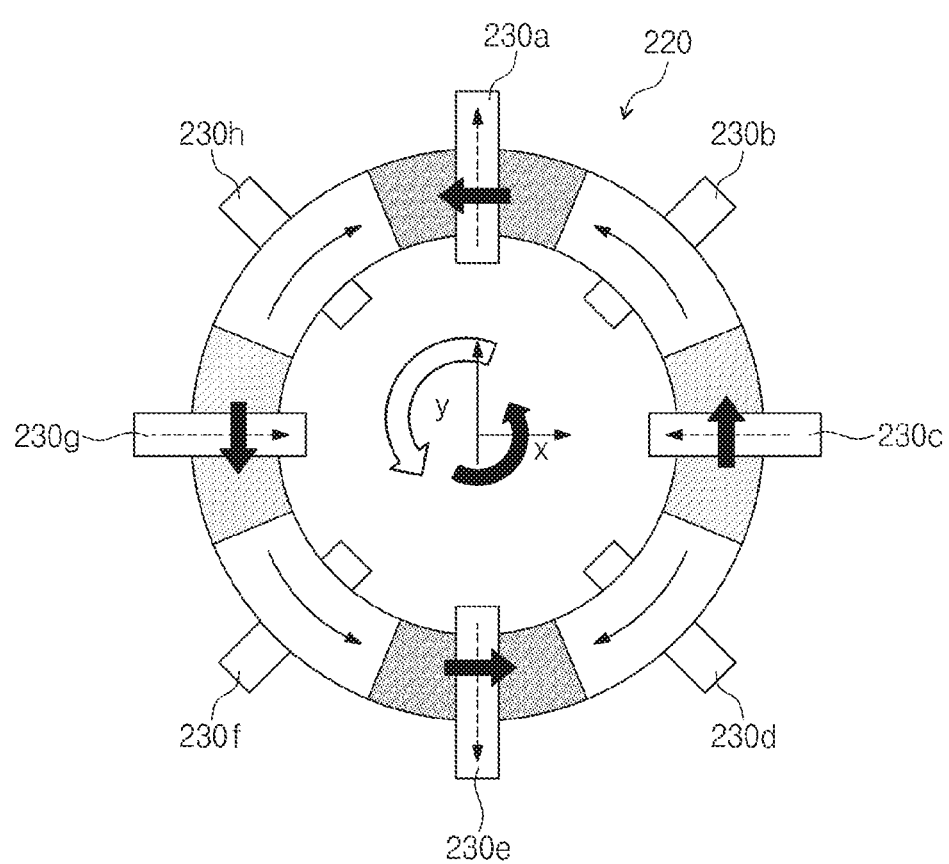

FIGS. 6A to 6F are views illustrating states where a controller controls a coil of the alignment member 215 of FIG. 5A to control moving directions of a target object. In more detail, FIG. 6A illustrates a state where the controller 160 controls the coil part 230 to move the target object 20 along the x-axis. FIG. 6B illustrates a state where the controller 160 controls the coil part 230 to move the target object 20 along the y-axis. FIG. 6C illustrates a state where the controller 160 controls the coil part 230 to move the target object 20 along the z-axis. FIG. 6D illustrates a state where the controller 160 controls the coil part 230 to rotate the target object 20 on the x-axis. FIG. 6E illustrates a state where the controller 160 controls the coil part 230 to rotate the target object 20 on the y-axis. FIG. 6F illustrates a state where the controller 160 controls the coil part 230 to rotate the target object 20 on the z-axis. FIGS. 6A to 6F illustrate the alignment member 215 when viewed from a plan view. However, in FIGS. 6A to 6F, the coils through which currents flow are illustrated on the magnet part 120 for the purpose of ease and convention in explanation. However, the coil 230 may be substantially disposed under the magnet part 220. In addition, in FIGS. 6A to 6F, a dotted line arrow denotes a direction in which the current is applied, a solid line arrow denotes a direction of the magnetic field, a thick black arrow denotes a direction of a resultant force of forces applied to the coil part 230 by the Lorentz force, and a thicker white arrow denotes a moving direction of the target object 20.

Referring to FIG. 6A, the controller 160 may supply currents to the first coil 230a and the fifth coil 230e. Since the currents are supplied to the first and fifth coils 230a and 230e, the electromagnetic forces may be induced to the coil part 230 by the Lorentz force. As illustrated in FIG. 6A, the resultant force in the x-axis direction may be applied to the first and fifth coils 230a and 230e, but the coil part 230 is fixed and is not moved. Thus, the magnet part 220 may be moved in a direction opposite to the x-axis direction (i.e., in the −x-axis direction shown by the thick white arrow in the center of the figure).

Referring to FIG. 6B, the controller 160 may supply currents to the third coil 230c and the seventh coil 230g. Since the currents are supplied to the third and seventh coils 230c and 230g, the electromagnetic forces may be induced to the coil part 230 by the Lorentz force. As illustrated in FIG. 6B, the resultant force in the y-axis direction may be applied to the third and seventh coils 230c and 230g, but the coil part 230 is fixed and is not moved. Thus, the magnet part 220 may be moved in a direction opposite to the y-axis direction (i.e., in the −y-axis direction shown by the thick white arrow in the center of the figure).

Referring to FIG. 6C, the controller 160 may supply currents to the second coil 230b, the fourth coil 230d, the sixth coil 230f, and the eighth coil 230h. Since the currents are supplied to the second, fourth, sixth and eighth coils 230b, 230d, 230f and 230h, the electromagnetic forces may be induced to the coil part 230 by the Lorentz force. As illustrated in FIG. 6C, the resultant force in the z-axis direction may be applied to the second, fourth, sixth and eighth coils 230b, 230d, 230f and 230h, but the coil part 230 is fixed and is not moved. Thus, the magnet part 220 may be moved in a direction opposite to the z-axis direction (i.e., in the −z-axis direction shown by the thick white arrow in the center of the figure).

Referring to FIG. 6D, the controller 160 may supply currents to the second coil 230b, the fourth coil 230d, the sixth coil 230f, and the eighth coil 230h. Since the currents are supplied to the second, fourth, sixth and eighth coils 230b, 230d, 230f and 230h, the electromagnetic forces may be induced to the coil part 230 by the Lorentz force. As illustrated in FIG. 6D, the electromagnetic force in the z-axis direction may be applied to the second coil 230b and the eighth coil 230h disposed at a front side of the x-axis passing through a central point of the magnet part 220 in a plan view, but the electromagnetic force in the −z-axis direction may be applied to the fourth coil 230d and the sixth coil 230f disposed at a rear side of the x-axis in a plan view. However, since the coil part 230 is fixed and is not moved, a portion of the magnet part 220 disposed at the front side of the x-axis in a plan view may receive the force in the −z-axis direction, and another portion of the magnet part 220 disposed at the rear side of the x-axis in a plan view may receive the force in the z-axis direction. Thus, the magnet part 220 may be rotated on the x-axis.

Referring to FIG. 6E, the controller 160 may supply currents to the second coil 230b, the fourth coil 230d, the sixth coil 230f, and the eighth coil 230h. Since the currents are supplied to the second, fourth, sixth and eighth coils 230b, 230d, 230f and 230h, the electromagnetic forces may be induced to the coil part 230 by the Lorentz force. As illustrated in FIG. 6E, the electromagnetic force in the z-axis direction may be applied to the sixth coil 230f and the eighth coil 230h disposed at a left side of the y-axis passing through the central point of the magnet part 220 in a plan view, but the electromagnetic force in the −z-axis direction may be applied to the second coil 230b and the fourth coil 230d disposed at a right side of the y-axis in a plan view. However, since the coil part 230 is fixed and is not moved, a portion of the magnet part 220 disposed at the left side of the y-axis in a plan view may receive the force in the −z-axis direction, and another portion of the magnet part 220 disposed at the right side of the y-axis in a plan view may receive the force in the z-axis direction. Thus, the magnet part 220 may be rotated on the y-axis.

Referring to FIG. 6F, the controller 160 may supply currents to the first coil 230a, the third coil 230c, the fifth coil 230e, and the seventh coil 230g. Since the currents are supplied to the first, third, fifth and seventh coils 230a, 230c, 230e and 230g, the electromagnetic forces may be induced to the coil part 230 by the Lorentz force. A direction of a resultant force of the electromagnetic forces induced by the first, third, fifth and seventh coils 230a, 230c, 230e and 230g may be in a clockwise direction around the z-axis. However, the coil part 230 is fixed and is not moved. Thus, the magnet part 220 may be rotated in a counterclockwise direction around the z-axis.

As described above, the supporting unit 10 including the alignment member 215 may freely move the target object 20 in the 6 degrees of freedom. Thus, it is possible to super-accurately align the position of the target object 20. In addition, since the coils supplied with the currents and supplying directions of the currents are controlled, the supporting unit 10 may easily align the target object 20. In particular, the target object 20 may be freely moved along the x-axis, the y-axis and z-axis and may also be freely rotated on each of the axes. Thus, the controller 160 may sense position data of the target object 20 using the sensor member 140, thereby aligning the target object 20 at a regular position. In addition, the target object 20 may be aligned using the alignment member 215 included in the supporting unit 10, so the supporting unit 10 may not need an additional driving member or motor. As a result, a size and a layout of an apparatus including the supporting unit 10 may be reduced. Furthermore, the supporting unit 10 may rotate the target object 20 at high speed. Thus, the supporting unit 10 may also be applied to a centrifugal machine.

Referring again to FIGS. 1 and 2, a substrate-treating apparatus performing a process on a substrate may include the supporting unit 10 described above. The supporting unit 10 may include one of the alignment member 115 and the alignment member 215 according to the aforementioned exemplary embodiments. A substrate W may be loaded on a top surface of the supporting unit 10, and the supporting unit 10 may support the substrate W. The substrate-treating apparatus may perform a treatment process on the substrate W. In some exemplary embodiments, the substrate-treating apparatus may perform an inspection process on the substrate W. Alternatively, the substrate-treating apparatus may perform one of other various processes on the substrate W supported by the supporting unit 10. In some exemplary embodiments, the substrate-treating apparatus may perform a transfer process of supporting and transferring the substrate W. The substrate W may be a transparent substrate or a semiconductor substrate.

In the exemplary embodiments described above, the coil parts 130 and 230 disposed under the magnet parts 120 and 220, respectively, are described as examples. Alternatively, the coil parts 130 or 230 may be provided at another position within the body 110. In addition, the coil parts 130 and 230 overlap with the magnet parts 120 and 220, respectively, in the aforementioned exemplary embodiments. However, the inventive concepts are not limited thereto. In some exemplary embodiments, the coil parts 130 or 230 may be disposed at another position at which the electromagnetic force generated by the current flowing through the coil parts 130 or 230 affects the magnet parts 120 or 220.

In addition, in the aforementioned exemplary embodiments, the magnet 120 having 6 sets of the Halbach arrays or the magnet 230 having 2 sets of the Halbach arrays, of which each has four magnet fragments, is described as an example. However, the inventive concepts are not limited thereto. In some exemplary embodiments, the number of the sets and the number of the magnet fragments may be variously changed. Moreover, eight coils are illustrated as an example in the aforementioned exemplary embodiments. However, the inventive concepts are not limited thereto. The number of the coil part may be various changed under a condition that the movement of the target object has the 6 degrees of freedom. Furthermore, the magnet parts 120 and 230 having the ring shapes are described as examples in the aforementioned exemplary embodiments. However, the inventive concepts are not limited thereto. The shape of the magnet part may be variously modified under the condition that the movement of the target object has the 6 degrees of freedom. The magnet part including the permanent magnet part having the Halbach arrays are illustrated as examples in the aforementioned exemplary embodiments. However, the inventive concepts are not limited thereto. If the magnet part includes a permanent magnet part capable of moving the target object in the 6 degrees of freedom, the magnet part may not include the Halbach array. The target object corresponding to the substrate W is described as an example in the aforementioned exemplary embodiments. However, the inventive concepts are not limited thereto. The target object may be another magnetic object that is movable by the electromagnetic force. Alternatively, the target object may be adhered to the lower body 110b.

According to exemplary embodiments, at least one of the coil part affecting the magnet part may be selected and the current direction of the selected coil part may be controlled. Thus, the target object may be smoothly moved in the 6 degrees of freedom and may be accurately aligned at the regular position. In addition, the target object may be rotated at high speed. As a result, it is possible to realize the supporting unit including the high-reliable alignment member and the substrate-treating apparatus including the supporting unit.

While exemplary embodiments have been described, it will be apparent to those skilled in the art that various changes and modifications may be made without departing from the spirits and scopes of the inventive concepts. Therefore, it should be understood that the above exemplary embodiments are not limiting, but illustrative. Thus, the scopes of the inventive concepts are to be determined by the broadest reasonable interpretation of the following claims and their equivalents, and shall not be restricted or limited by the foregoing description.

What is claimed is:
1. A substrate-treating apparatus comprising:
a supporting unit on which a substrate is loaded, the supporting unit comprising:
a body having a top surface on which the substrate is loaded;
an alignment member disposed in the body to adjust a position of the substrate;

at least one sensor configured to sense the position of the substrate; and a controller configured to control the alignment member and the sensor, wherein the alignment member comprises:

a magnet part that adjusts the position of the substrate according to an electromagnetic force; and a coil part that applies the electromagnetic force to the magnet part, wherein the body comprises an upper body and a lower body, the upper body having the top surface on which the substrate is loaded, and the supporting unit further comprises an elevating member that is positioned in a hollow region at a center of the body, the elevating member configured to move the upper body vertically with respect to the lower body.

2. The substrate-treating apparatus of claim 1, wherein the magnet part has a Halbach array.

3. The substrate-treating apparatus of claim 2, wherein the magnet part has a ring shape.

4. The substrate-treating apparatus of claim 3, wherein the coil part overlaps with the magnet part.

5. The substrate-treating apparatus of claim 4, wherein the coil includes a plurality of coils, and wherein the plurality of coils are arranged along a circumference direction of the magnet part.

6. The substrate-treating apparatus of claim 5, wherein the plurality of coils includes eight coils.

7. The substrate-treating apparatus of claim 6, wherein the controller is configured to supply a current to at least one of the plurality of coils to generate the electromagnetic force such that the substrate has 6 degrees of freedom so as to be aligned.

8. The substrate-treating apparatus of claim 2, wherein the magnet part includes permanent magnet part having 6 sets of the Halbach array.

9. The substrate-treating apparatus of claim 1, wherein the controller controls to move the elevating member vertically.

10. A supporting unit comprising:

a body having a top surface supporting a target object;

an alignment member disposed in the body and configured to adjust a position of the target object;

at least one sensor configured to sense the position of the target object; and a controller configured to control the alignment member and the sensor, wherein the alignment member comprises:

a magnet part that adjusts the position of the target object according to an electromagnetic force; and a coil part that applies the electromagnetic force to the magnet part, wherein the body comprises an upper body and a lower body, the upper body having the top surface supporting the target object, and the supporting unit further comprises an elevating member that is positioned in a hollow region at a center of the body, the elevating member configured to move the upper body vertically with respect to the lower body.

11. The supporting unit of claim 10, wherein the magnet part has a Halbach array.

12. The supporting unit of claim 11, wherein the magnet part has a ring shape.

13. The supporting unit of claim 12, wherein the coil part comprises a plurality of coils, and wherein the plurality of coils are arranged along a circumference direction of the magnet part.

14. The supporting unit of claim 13, wherein the plurality of coils comprises eight coils.

15. The supporting unit of claim 14, wherein the controller is configured to supply a current to at least one of the plurality of coils to generate the electromagnetic force such that the target object has 6 degrees of freedom so as to be aligned.

16. A supporting unit comprising:

a moveable upper body;

a stationary lower body;

an alignment member disposed between the moveable upper body and the stationary lower body and configured to move the moveable upper body by an electromagnetic force such that the moveable upper body moves with six degrees of freedom with respect to the stationary lower body;

an elevating member that is positioned at a center of the moveable upper body and the stationary lower body, and configured to move the moveable upper body vertically with respect to the stationary lower body in order to load or unload a substrate on the moveable upper body; and a controller configured to control the alignment member to move the moveable upper body.

17. The supporting unit of claim 16, wherein the alignment member comprises a magnet and a coil, one of the magnet and the coil is attached to the moveable upper body and the other one of the magnet and the coil is attached to the stationary lower body, and the controller is configured to supply a current to the coil in order to generate the electromagnetic force between the magnet and the coil to move the moveable upper body.

18. The supporting unit of claim 17, wherein the magnet comprises a plurality of permanent magnet fragments arranged in a ring, the coil comprises a plurality of coils arranged along the ring, and the controller supplies a current to at least two of the plurality of coils.

19. The supporting unit of claim 18, wherein the permanent magnetic fragments are arranged in at least one Halbach array.

20. The supporting unit of claim 16, wherein the controller controls to move the elevating member vertically.

* * * * *